United States Patent
Gorman et al.

(10) Patent No.: US 7,413,778 B2
(45) Date of Patent: Aug. 19, 2008

(54) BOND COAT WITH LOW DEPOSITED ALUMINUM LEVEL AND METHOD THEREFORE

(75) Inventors: Mark Daniel Gorman, West Chester, OH (US); Brett Allen Boutwell, West Chester, OH (US); Robert George Zimmerman, Jr., Morrow, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/295,278

(22) Filed: Dec. 5, 2005

(65) Prior Publication Data
US 2007/0128360 A1    Jun. 7, 2007

(51) Int. Cl.
*B05D 1/00* (2006.01)
*B05D 3/00* (2006.01)
*B05D 3/02* (2006.01)
*F03B 1/00* (2006.01)
*F03B 3/00* (2006.01)

(52) U.S. Cl. .................. 427/383.7; 427/532; 427/455; 427/456; 427/405; 416/241 R

(58) Field of Classification Search .............. 427/532, 427/535, 540, 446, 455, 456, 383.1, 383.3, 427/383.7, 404, 405; 416/241 R; 148/240
See application file for complete search history.

(56) References Cited

U.S. PATENT DOCUMENTS

| | | | | |
|---|---|---|---|---|
| 4,055,705 | A | 10/1977 | Stecura et al. | 428/633 |
| 4,328,285 | A | 5/1982 | Siemers et al. | 428/633 |
| 5,216,808 | A | 6/1993 | Martus et al. | 29/889.1 |
| 5,236,745 | A | 8/1993 | Gupta et al. | 427/454 |
| 6,283,714 | B1 * | 9/2001 | Rigney et al. | 416/241 R |
| 6,291,084 | B1 | 9/2001 | Darolia et al. | 428/633 |
| 6,896,488 | B2 | 5/2005 | Bruce et al. | 416/241 |
| 2004/0180232 | A1 * | 9/2004 | Das et al. | 428/610 |

* cited by examiner

*Primary Examiner*—Michael La Villa
(74) *Attorney, Agent, or Firm*—Harrington & Smith, PC

(57) ABSTRACT

A method for applying a NiAl based bond coat and a diffusion aluminide coating to a metal substrate comprises, in part, coating a portion of the external surface of the superalloy substrate, by physical vapor deposition with a layer of a NiAl based metal alloy, wherein the deposited NiAl based metal alloy includes a controlled amount of about 6 to 25 weight percent aluminum, wherein the deposited aluminum level of the NiAl based metal alloy is controlled to be about 50-100% of its final level after aluminizing to form a coated external portion; and subsequently, simultaneously aluminizing the coated external portion and a different surface of the superalloy substrate.

14 Claims, 2 Drawing Sheets

BOND COAT WITH LOW DEPOSITED ALUMINUM LEVEL AND METHOD THEREFORE

FIELD OF THE INVENTION

The invention relates to a process for applying a bond coat comprising nickel, aluminum and chromium to the external surface of a gas turbine engine component.

BACKGROUND OF THE INVENTION

Higher operating temperatures for gas turbine engines are continuously sought in order to increase efficiency. However, as operating temperatures increase, the high temperature durability of the components within the engine must correspondingly increase.

Significant advances in high temperature capabilities have been achieved through the formulation of nickel- and cobalt-based superalloys. For example, some gas turbine engine components may be made of high strength directionally solidified or single crystal nickel-based superalloys. These components are cast with specific external features to do useful work with the core engine flow and often contain internal cooling details and through-holes to provide external film cooling to reduce airfoil temperatures.

When exposed to the demanding conditions of gas turbine engine operation, particularly in the turbine section, the base alloy alone may be susceptible to damage, such as oxidation and corrosion attack, and may not retain adequate mechanical properties. Accordingly, the base alloys are often protected with various types of coating systems depending upon the engine part and operating environment.

Thus, engine components that operate at high temperatures often require environmental coatings to provide protection from oxidation and corrosion. The environmental coating may be used to provide further function as a bond coat for a thermal barrier coating. A typical example of these components is a cooled turbine blade.

The exterior surfaces of the blade frequently utilize a coating system such as platinum aluminide, MCrAlY overlay, or optimally an overlay NiAl based coating. This coating is often additionally coated with the TBC material, such as 7YSZ.

Scientists and engineers working under the direction of Applicant's Assignee and continually seeking new bond coats having improved capabilities that can be applied to articles, such as gas turbine engine components, to withstand the harsh operating conditions of the engine, as well as methods for applying such bond coats to gas turbine engine components. The claimed invention fulfills this need and others.

BRIEF DESCRIPTION OF THE INVENTION

In accordance with one embodiment of the invention, a method for applying a NiAl based bond coat and a diffusion aluminide coating to a metal substrate is disclosed. The method comprises providing a superalloy substrate, the superalloy substrate having an external surface; and optionally cleaning the external surface of the superalloy substrate. The method further comprises coating a portion of the external surface of the superalloy substrate, by physical vapor deposition with a layer of a NiAl based metal alloy, wherein the deposited NiAl based metal alloy includes a controlled amount of about 6 to 25 weight percent aluminum to form a coated external portion, additionally the deposited aluminum level of the NiAl based metal alloy is controlled to be about 50-100% of its final level after aluminizing; and subsequently, simultaneously aluminizing the coated external portion and a different surface of the superalloy substrate. Advantageously, a diffusion aluminide layer is formed on the different surface and the NiAl based metal alloy becomes a NiAl based bond coat, wherein the NiAl based bond coat comprises between about 12 to 25 weight percent aluminum, and the NiAl based bond coat has a uniform distribution of aluminum and other modifying elements selected from at least one of Cr, Zr and Hf throughout the NiAl based bond coat.

In accordance with another embodiment of the invention, a method for applying a NiAl based bond coat and a diffusion aluminide coating to a metal substrate is disclosed. The method comprises providing a superalloy substrate, the superalloy substrate having an internal passage therein defined by an internal surface, and an external surface. The method further comprises optionally cleaning the internal and external surface of the superalloy substrate; coating the external surface of the superalloy substrate, by cathodic arc deposition, with a layer of a NiAl based metal alloy, wherein the deposited NiAl based metal alloy includes a controlled amount of about 6 to 25 weight percent aluminum, additionally the deposited aluminum level of the NiAl based metal alloy is controlled to be about 50-100% of its final level after aluminizing; and subsequently, simultaneously aluminizing the external surface and the internal surface of the superalloy substrate. Advantageously, a diffusion aluminide layer is formed on the internal surface and the NiAl based alloy becomes a NiAl based bond coat on the external surface of the superalloy substrate, wherein the NiAl based bond coat comprises between about 12 to 25 weight percent aluminum, and has a uniform distribution of aluminum and other modifying elements selected from at least one of Cr, Zr and Hf throughout the NiAl based bond coat.

In accordance with a further embodiment of the invention, a gas turbine engine component is disclosed. The component comprises a superalloy substrate having an external surface, wherein a portion of the external surface is coated with a layer of a NiAl based metal alloy including a controlled amount of about 6 to 25 weight percent aluminum, additionally the deposited aluminum level of the NiAl based metal alloy is controlled to be about 50-100% of its final level after aluminizing, which is subsequently aluminized to simultaneously form a diffusion aluminide layer on a different surface of the superalloy substrate and a NiAl based bond coat on the portion of the external surface of the superalloy substrate. Advantageously, the NiAl based bond coat comprises about 12 to 25 weight percent aluminum, and has a uniform distribution of aluminum and other modifying elements selected from at least one of Cr, Zr and Hf throughout the NiAl based bond coat.

Other features and advantages will be apparent from the following more detailed description and drawings, which illustrates by way of example the principles of the invention.

DETAILED DESCRIPTION OF THE INVENTION

Figure 1:
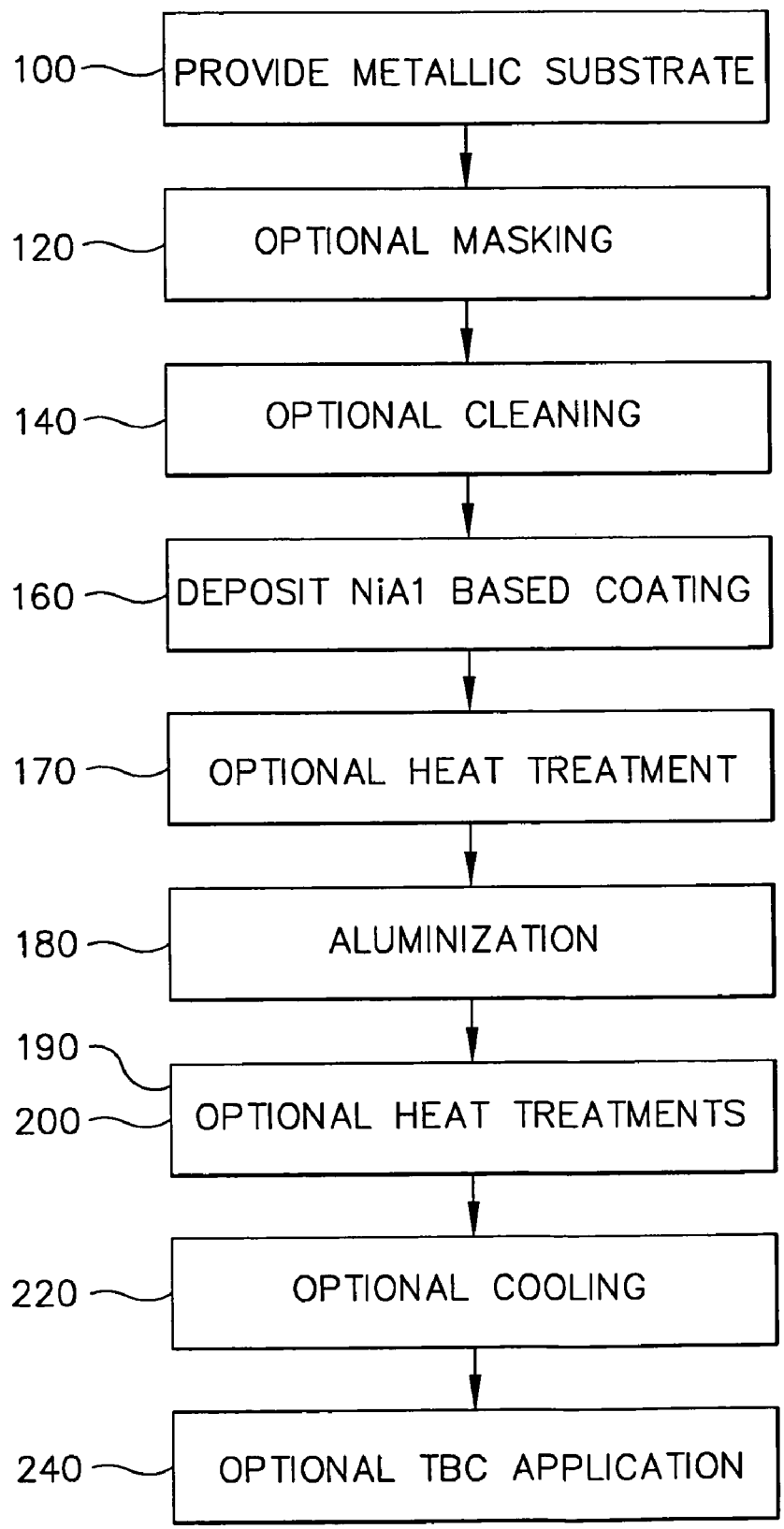
FIG. 1 is a process flow chart showing a method of coating a gas turbine engine component, in accordance with one embodiment of the invention.

Referring to FIG. 1, in accordance with an embodiment of the invention, shown is a method for applying a NiAl based alloy, such as a NiAlCrZr or NiAlCrHf overlay layer to the external surface and a diffusion aluminide coating to the internal surface of a gas turbine engine component, wherein the NiAl based alloy has a controlled amount of aluminum which is less than that of the final NiAl based bond coat after aluminizing. The component comprises a metallic substrate material having an internal passage therein defined by an internal surface, and an external surface. An example of such a component is a turbine blade 20 shown in FIG. 2 having cooling holes therein, which is described in further detail below.

As shown in FIG. 1, the first step (100) of one embodiment of the invention comprises providing the substrate having an internal passage therein defined by an internal surface, and an external surface.

While turbine blade (20) has an internal passage therein defined by an internal surface, the processes described herein are also applicable to components that do not have an internal surface including, but not limited to, solid low pressure turbine blades or shrouds. For example, one may coat exterior surface areas that have poor line of sight, such as pockets in the under platform area of a turbine blade, as well as coat various areas of a component with a different coating that employs diffusion aluminizing, such as platinum aluminide, for enhanced hot corrosion protection for under platform areas. This feature is particularly beneficial because different areas of a part often have different environmental exposures and may be best protected by a different type of aluminide coating. For instance, under platform areas of some turbine blades operate below about 871° C. and may be susceptible to hot corrosion, which may be preferably protected with an aluminide coating including different modifiers such as platinum. Another example includes closely dimensioned features such as attachment hooks on shrouds, which do not need the full protection afforded by a NiAl coating and may not tolerate the dimensional increase from an overlay coating.

Optionally, a portion of the substrate may be masked to prevent deposition of the NiAl based coating on portions of the line of sight external surface, as desired. Such masking techniques (120) are known in the art.

Optionally, the internal and/or external surfaces may be cleaned (140) to remove any dirt or other particles from the component.

A NiAl based alloy is then provided (160) to be deposited on the component. The NiAl based material is typically formulated in the form of a cathode or cathodes in which the composition is selected such that when evaporated and deposited on the part, provides the desired composition. See, U.S. Pat. No. 6,291,084, the contents of which are hereby incorporated by reference. The cathodic arc process, also known as ion plasma deposition, is a process that belongs to the family of physical vapor deposition (PVD) coating processes: In the cathodic arc process, coating films are deposited from the condensation of energetic ions. Cathode material, like NiAl alloy, is evaporated by a metal vapor arc that ionized that cathode material. Metallic ions move away from the cathode surface and are deposited onto components creating coating films. A negative bias potential is often applied to the components being coated to accelerate and attract the metallic ions. The process is controlled by controlling the cathode current, typically 60-120 amperes and the deposition bias potential, typically −20–50 volts. The NiAl based alloy is typically deposited to a thickness of about 0.0005-0.005 inches (0.0127-0.127 mm). Alternatively, other PVD processes, such as EB-PVD and sputtering may be used.

Advantageously, the composition of the NiAl based alloy is controlled to have a level of aluminum less than that of the final bond coat after processing. More particularly, the aluminum level can be controlled to about 50-100 wt. % or more desirably about 75-100 wt. % of the desired final level. For instance, if the final desired aluminum level is 24 wt. %, the deposited NiAl based alloy should contain between 12 and 24 wt. % aluminum. The result is a substantially uniform aluminum level throughout the coating and thus no undesirable gradients of higher aluminum content at the surface. Uniformity of the coating composition throughout the coating is advantageously better than can be expected from, for example, a straight diffusion coating. In contrast, at lower deposited aluminum levels there is a significant aluminum gradient in the coating with higher levels at the surface and lower levels deeper in the coating. Therefore, the level at the surface may be higher than desired and the gradient may cause it to deplete too readily in service. Also, if the initial aluminum level is too low there will be substantial aluminum diffusion into the surface. The desirable additions of modifying elements such as Cr and Zr would thus be diluted and excessive compositional gradients being lower at the surface may occur. Diffusion coatings typically rely on compositional gradients to form, and the ability to control additional modifying elements is thus limited. In addition, diffusion coatings typically consume some of the substrate material and reduce the load bearing cross section of the component.

Additionally, the deposited aluminum material (before aluminizing) should not have an aluminum level greater than the final desired level as it may not be reduced to the desired level during aluminizing. Moreover, another advantage is that lower aluminum cathodes (source materials for ion plasma deposition) are much easier to manufacture due to reduced brittleness and melting point.

A heat treatment step (170) performed in a vacuum at a temperature in the range of about 1900° F. (1038° C.) to about 2050° F. (1121° C.) for about 2 to about 4 hours may optionally be performed, if desired, to aid the consolidation and bonding of the NiAl based alloy.

The next step of the process is an aluminizing step (180) in which aluminum is deposited and diffused into the NiAl based coating, creating a NiAl based layer having a thickness in the range of between about 0.0005 and about 0.005 inches (0.0127 and about 0.127 mm). Simultaneously, the aluminization step deposits a diffusion aluminide layer onto the internal surface of the component to a depth of diffusion in the range of about 0.0005 to about 0.003 inches (0.0127 to about 0.076 mm). Vapor Phase Aluminization (VPA) may be employed in this step. VPA may be accomplished by heating the components in a retort purged of oxygen and surrounded by an aluminum bearing donor material. A halogen activator is added to the retort to facilitate the transfer of aluminum from the donor to the part. VPA operation may be conducted at temperatures of about 1800-2000° F. (about 982-1093° C.) for times of about 2-10 hours. Variations of this process include pack cementation and chemical vapor deposition and may be alternatively used.

An additional heat treatment step (190) performed in a vacuum at a temperature in the range of about 1900° F. (1038° C.) to about 2050° F. (1121° C.) for about 2 to about 4 hours may optionally be performed, if desired, to further diffuse the aluminum into the NiAl base coating.

An optional next step includes an oxidative heat treatment (200) in which the substrate is heated in an oxygen-containing atmosphere to a preselected temperature for a preselected period of time to cause formation of a substantially alumina scale on the surface of the NiAl based diffusion layer on the external surface of the substrate and an alumina scale on the surface of the aluminide layer on the internal surface of the substrate. This heat treatment may be performed in a PVD chamber under partial oxygen pressure of about $10^{-3}$ bar, from about 1830° F. (999° C.) to about 2010° F. (1099° C.) for about 4 to about 10 minutes.

The component may then be optionally cooled (220) to ambient temperature, followed by an optional application (240) of a TBC layer to the external surface of the NiAl based coating.

Figure 2:
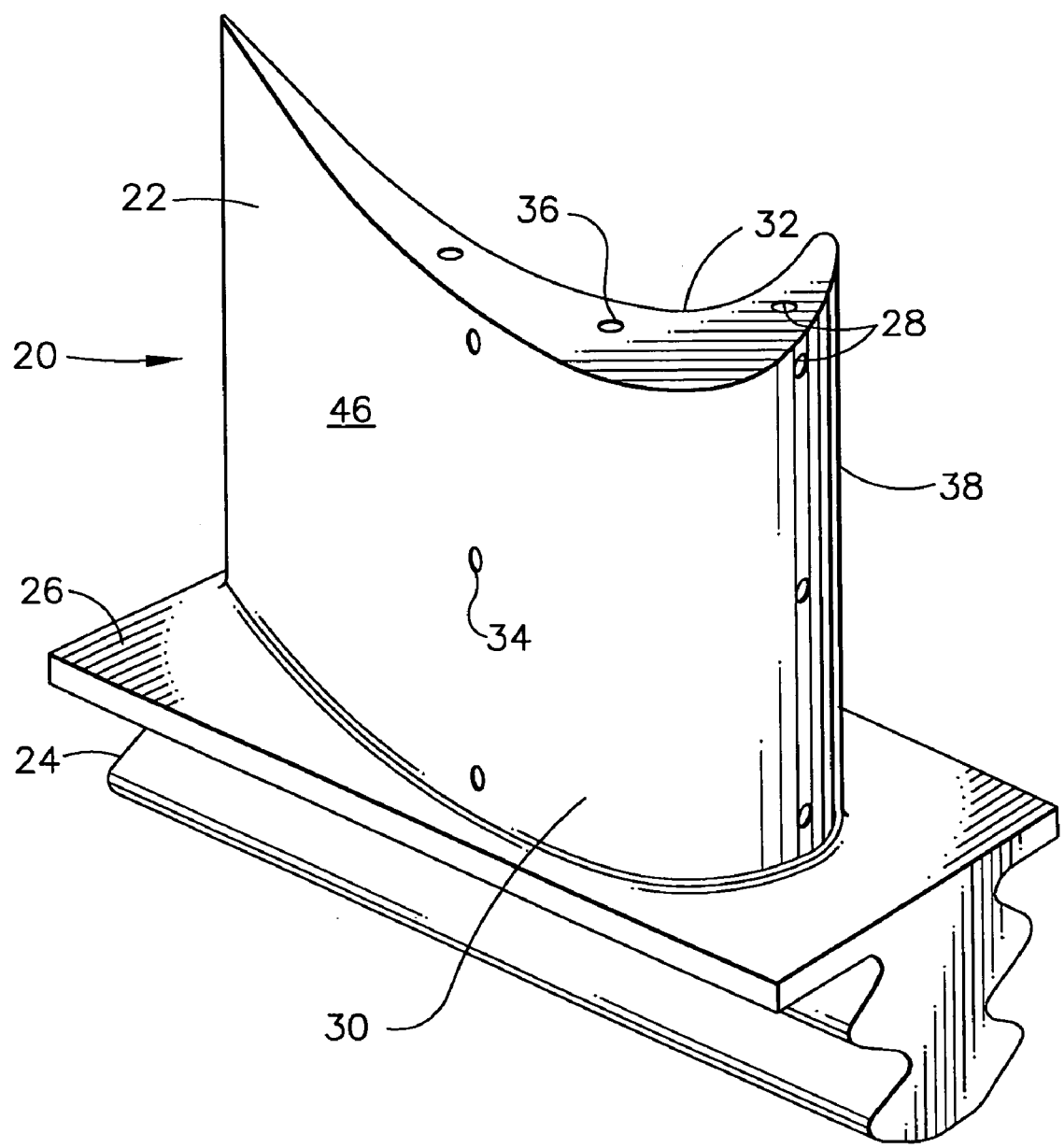
FIG. 2 shows a coated gas turbine blade, in accordance with one embodiment of the invention.

Embodiments of the invention will be described in further detail with reference to FIG. 2. Referring to FIG. 2, there is shown a component article of a gas turbine engine, such as a turbine blade 20 coated with a NiAl based bond coat and diffusion aluminide inner coating, in accordance with an embodiment of the invention. It should be recognized that turbine blade 20 is merely one example of a suitable article to be coated, and other articles including, but not limited to turbine vanes, solid components, etc. are acceptable in accordance with embodiments of the invention. Similarly, while blade 20 will be referred to herein, it should be. recognized that the descriptions apply to any suitable article.

The blade 20 may be made of any suitable material, and is typically a nickel-base, iron-base, cobalt-base superalloy, or combination thereof. Single crystal nickel-base superalloys are particularly suitable materials for the substrates described herein. The blade 20 includes an airfoil 22 against which the flow of hot exhaust is directed. The blade 20 is mounted to a turbine disk (not shown) by a dovetail 24 that extends downwardly from the airfoil 22 and engages a slot on the turbine disk. A platform 26 extends longitudinally outward from the area where the airfoil 22 is joined to the dovetail. A number of internal cooling passages extend through the internal section of the airfoil 22, ending in openings 28 in the surface of airfoil 22. The airfoil may be described as having a root end 30 adjacent to the dovetail 24, and an oppositely disposed tip end 32 remote from the dovetail 24. The internal cooling passages 34 each have an internal surface 36, and there is also an external airfoil surface 38 of the metallic portion of the airfoil 22.

First, a NiAl based metal alloy is applied to the external airfoil surface 38. However, the airfoil 22 may be optionally cleaned by conventional methods prior to this application.

The NiAl based metal alloy advantageously has a controlled level of aluminum, which is less than that desired in the final application. The NiAl based metal alloy may comprise any suitable NiAl based coating, including but not limited to NiAlCrZr, NiAlCrHf, and combinations thereof, having the desired aluminum content of about 25 weight percent or less, such as between about 6 and 25 weight percent. For example, the aluminum level in the ion plasma deposit can be in this range depending upon the specific final aim. Thus, the aluminum level in the source material can be adjusted along with the ion plasma deposition parameters to achieve this range, as one skilled in the art would understand how to do. Additionally, the Cr content in the NiAl based coating is typically between about 2 and 10 weight percent. Examples of suitable source material compositions for the NiAl based alloy include, in approximate weight percent, 12-25Al, 2-10Cr, 0.5-2.0Zr, balance Ni; and 19.53Al, 6.37Cr, 1.85Zr, balance Ni.

Applicant has advantageously determined how to control the aluminum level of the overlay material and the diffusion aluminide process so that at the completion of processing the desired final aluminum level is obtained in the outer overlay areas and in the desired diffusion coated areas, such as internal areas. The NiAl based alloy is applied to the desired thickness and composition. The VPA process is conducted at an aluminum activity level that achieves the desired final aluminum concentration and for a time sufficient to obtain the aluminized layer in the non-line of sight and any internal surfaces. Aluminum activity in the VPA process is controlled by adjusting process temperature, donor concentration, activator material and gas flow. These relationships are known to those skilled in the art.

Simultaneously, the external surface 38 and the internal surface 36 are aluminized by vapor phase aluminizing, whereby a diffusion aluminide layer is formed on the internal surface 36 and the NiAl based alloy becomes a NiAl based bond coat 46 on the external surface 38 of the superalloy substrate.

Bond coat 46 overlies and contacts the external airfoil surface 38. The thickness of the bond coat 46 is typically from about 0.0005 to about 0.005 inches (0.0127 to about 0.127 mm) thick. During the aluminizing process, aluminum is diffused into the NiAl based alloy bringing it to the desired final aluminum level. This step may be performed by VPA or alternatively by pack cementation or CVD.

Desirably, bond coat 46 has a substantially uniform coating composition and comprises a greater level of aluminum than prior to aluminizing. The aluminum level of bond coat 46 is typically between about 12 and 25 weight percent.

A thermal barrier coating TBC (not shown) is generally deposited on top of the bond coat 46. The thermal barrier coating may comprise any suitable ceramic material alone or in combination with other materials. For example, thermal barrier coating may comprise fully or partially stabilized yttria-stabilized zirconia and the like, as well as other low conductivity oxide coating materials known in the art. Examples of other suitable ceramics include, but are not limited to, about 92-93 weight percent zirconia stabilized with about 7-8 weight percent yttria, among other known ceramic thermal barrier coatings. The thermal barrier coating may be applied by any suitable methods. One suitable method for deposition is by electron beam physical vapor deposition (EB-PVD), although plasma spray deposition processes, such as air plasma spray (APS), also may be employed. More particular examples of ceramic thermal barrier coatings are described in U.S. Pat. Nos. 4,055,705, 4,328,285, 5,216,808 and 5,236,745 to name a few. The thermal barrier coating may also be applied to any desired thickness. For example, the coating may have a thickness between about 75 micrometers and about 300 micrometers.

EXAMPLE

Rene' N5 and Rene' N6 samples were coated with a cathode having the following compositions, using an ion plasma process (cathodic arc): 19.53Al-6.37Cr-1.85Zr-bal Ni. The NiAl based alloy was applied about 0.0015 inches (0.0381 mm) thick. The samples were then overcoated using a standard vapor phase aluminizing (VPA) process. Microstructural evaluation of the samples indicated that the samples had aluminum levels greater than 20 weight percent after VPA. XRF analysis indicated that a substantial Zr content remained after processing.

The above Example demonstrates the ability to simultaneously achieve desired levels of aluminum and modifying elements while also providing for an aluminide coating on internal and non-line of sight areas of a component or areas for which the full capability of the overlay NiAl bond coat is not desired.

Further advantages of embodiments of the invention include a component coating process that is compatible with the needs of internal surfaces and selected external surfaces that utilize NiAl class overlay coatings without extra processing steps, excessive coating growth, excessive wall loss from stripping and reduction of coating performance in the overlay areas.

A further advantage of embodiments of the invention is addressing the problem that some processes used to apply the diffusion aluminide to the interior surfaces of the blades can interfere with the performance of the deposited NiAl based coating. For example, if the interior of the surface is coated first, then the exterior surfaces tend to become coated resulting in excessive coating thickness after addition of the NiAl based coating or loss of wall thickness if that coating is stripped before application of the NiAl based coating. Satisfactory masking materials to prevent the general aluminizing of the external surface are typically not available without interfering with internal coating or detrimentally affecting the overlay coating. Moreover, processes that only coat the internal surfaces, such as slurry processes, often have drawbacks including difficult removal of the slurry materials after the deposition process.

Additionally, Applicant's coating source materials are not excessively brittle and are compatible with conventional casting, machining and handling processes and therefore are available at lower cost.

A further advantage of embodiments of the invention is the ability to optimize the level and dispersion of reactive elements, such as Hf and Zr. For example, during deposition of the overlay material with reduced aluminum content, the solubility level of the reactive elements is high permitting those elements to remain uniformly dispersed in solid solution. If during the subsequent diffusion aluminizing cycle the solubility of the reactive elements is exceeded, a more uniform and desirable dispersion of precipitates will occur compared to those know to form during full chemistry deposition. Further, higher levels of the reactive elements may be employed allowing improved coating performance without undesirable impact of poor dispersion of reactive elements. For instance, zirconium is a desirable strengthener of. beta NiAl (B2 crystal form). However, the solubility of Zr is low and undesirable precipitate morphology can form in standard processing and limit coating oxidation resistance.

While various embodiments are described herein it will be appreciated from the specification that various combinations of elements, variations or improvements therein may be made by those skilled in the art, and are within the scope of the invention.

What is claimed is:

1. A method for applying a NiAl based bond coat and a diffusion aluminide coating to a metal substrate comprising:
   providing a superalloy substrate, the superalloy substrate having an external surface;
   optionally cleaning the external surface of the superalloy substrate;
   coating a portion of the external surface of the superalloy substrate, by physical vapor deposition with a layer of a NiAl based metal alloy, wherein the deposited NiAl based metal alloy includes a controlled amount of about 6 to 25 weight percent aluminum to form a coated external portion, wherein the deposited aluminum level of the NiAl based metal alloy is controlled to be about 50-100 weight % of its final level after aluminizing; and
   subsequently, intentionally and desirably simultaneously aluminizing the coated external portion and a different surface of the superalloy substrate, whereby a diffusion aluminide layer is formed on the different surface and the NiAl based metal alloy becomes a NiAl based bond coat, wherein the NiAl based bond coat comprises between about 12 to 25 weight percent aluminum, wherein the NiAl based bond coat has a uniform distribution of aluminum and other modifying elements selected from the group consisting of Cr, Zr and Hf and mixtures thereof throughout the NiAl based bond coat, and wherein the different surface of the superalloy substrate, which is aluminized, is selected from the group consisting of an external, underportion of a blade platform, an attachment hook of a shroud, and combinations thereof.

2. The method of claim 1, wherein the aluminum level of the physical vapor deposited NiAl based alloy is controlled to be about 75 to 100 weight percent of the aluminum in the NiAl based bond coat after processing.

3. The method of claim 1, wherein the physical vapor deposition is selected from the group consisting of cathodic arc deposition, electron beam physical vapor deposition and sputtering.

4. The method of claim 3, wherein the physical vapor deposition is cathodic arc deposition.

5. The method of claim 1, wherein the aluminizing step method is selected from the group consisting of vapor phase aluminizing, chemical vapor deposition and pack cementation.

6. The method of claim 5, wherein the aluminizing step is vapor phase aluminizing.

7. The method of claim 1, wherein the coating step comprises applying the NiAl based metal alloy using source material having a composition, in approximate weight percent, of 12-25Al, 2-10Cr, 0.5-2.0Zr, balance Ni.

8. The method of claim 1, further comprising heating in a vacuum to between about 1038° C. and about 1121° C. for about 2 to 4 hours after deposition of the NiAl based alloy and before aluminizing to aid consolidation and bonding of the deposited material.

9. The method of claim 1, further comprising heating in a vacuum to between about 1038° C. and about 1121° C. for about 2 to 4 hours after aluminizing to further diffuse the aluminum into the NiAl based bond coat, followed by an optional oxidative heat treatment.

10. The method of claim 1 further comprising depositing a thermal barrier coating over the NiAl base bond coat.

11. The method of claim 1, wherein the superalloy substrate is selected from the group consisting of a nickel-base superalloy or cobalt base superalloy.

12. The method of claim 11, wherein the superalloy substrate is a single crystal nickel base superalloy.

13. The method of claim 1, further comprising between about 2 and 10 weight percent Cr in the NiAl base metal alloy.

14. A method for applying a NiAl based bond coat and a diffusion aluminide coating to a metal substrate comprising:
   providing a superalloy substrate, the superalloy substrate having an external surface;
   optionally cleaning the external surface of the superalloy substrate;
   coating a portion of the external surface of the superalloy substrate, by physical vapor deposition with a layer of a NiAl based metal alloy, wherein the deposited NiAl based metal alloy includes a controlled amount of about 6 to 25 weight percent aluminum to form a coated external portion, wherein the deposited aluminum level of the NiAl based metal alloy is controlled to be about 50-100 weight % of its final level after aluminizing; and
   subsequently, simultaneously intentionally and desirably aluminizing the coated external portion and a different surface of the superalloy substrate, whereby a diffusion aluminide layer is formed on the different surface and the NiAl based metal alloy becomes a NiAl based bond coat, wherein the NiAl based bond coat comprises between about 12 to 25 weight percent aluminum, wherein the NiAl based bond coat has a uniform distribution of aluminum and other modifying elements selected from the group consisting of Cr, Zr and Hf and mixtures thereof throughout the NiAl based bond coat, and wherein the coating step comprises applying the NiAl based metal alloy using source material having a composition, in approximate weight percent, of 19.53Al-6.37Cr-1.85Zr, balance Ni, wherein the different surface of the superalloy substrate, which is aluminized, is selected from the group consisting of an external, underportion of a blade platform and an attachment hook of a shroud, and combinations thereof.

* * * * *